United States Patent
Chen et al.

(10) Patent No.: US 7,183,869 B2
(45) Date of Patent: Feb. 27, 2007

(54) CIRCUIT AND METHOD FOR TEMPERATURE COMPENSATION

(75) Inventors: Kuo-Hsiang Chen, Hsinchu (TW); Chun-Ku Lin, Hsinchu County (TW); Jason Chen, Hsinchu (TW)

(73) Assignee: Holtek Semiconductor, Inc., Hsinchu (TW)

(*) Notice: Subject to any disclaimer, the term of this patent is extended or adjusted under 35 U.S.C. 154(b) by 133 days.

(21) Appl. No.: 11/147,026

(22) Filed: Jun. 7, 2005

(65) Prior Publication Data

US 2006/0158276 A1 Jul. 20, 2006

(30) Foreign Application Priority Data

Jan. 17, 2005 (TW) .............. 94101349 A

(51) Int. Cl.
*H03L 1/00* (2006.01)
*G01J 5/20* (2006.01)
*G01R 23/10* (2006.01)

(52) U.S. Cl. .................. 331/176; 331/44; 331/66

(58) Field of Classification Search ............. 331/44, 331/66, 176
See application file for complete search history.

(56) References Cited

U.S. PATENT DOCUMENTS

| 5,525,936 | A | * | 6/1996 | Post et al. ............... 331/47 |
| 6,167,527 | A | * | 12/2000 | Little et al. ............. 713/500 |
| 2006/0170398 | A1 | * | 8/2006 | Gangsto et al. ......... 320/132 |

* cited by examiner

*Primary Examiner*—Robert Pascal
*Assistant Examiner*—James Goodley
(74) *Attorney, Agent, or Firm*—Volpe and Koenig, P.C.

(57) ABSTRACT

In the present invention, a temperature compensation circuit is provided. The temperature compensation circuit includes a first oscillator for providing a first clock signal, a timer electrically connected to the first oscillator for clocking a specific time period, a voltage regulator for generating a constant voltage, a second oscillator electrically connected to the voltage regulator for providing a second clock signal, and a counter electrically connected to the second oscillator for counting within the specific time period based on the second clock signal so as to obtain a counting value, and thereby a frequency of the second oscillator is obtained for the temperature compensation.

18 Claims, 2 Drawing Sheets

CIRCUIT AND METHOD FOR TEMPERATURE COMPENSATION

FIELD OF THE INVENTION

The present invention relates to a circuit and method, and more particularly to a circuit and method for temperature compensation.

BACKGROUND OF THE INVENTION

The watchdog timer is a technique widely applied in the microprocessor control unit (MCU). Generally, the MCU includes an oscillator (OSC) with an intrinsic free run function, a counter that is able to be cleared by software and a circuit for generating a reset signal when the counter overflows. The oscillator provides a clock source for the counter. The MCU is regarded as malfunctioning if the counter is unable to be cleared within a specific time period. In such situation, the reset signal is correspondingly generated by the circuit for restoring the MCU to a normal operation.

The temperature compensation technique is extensively used in the measurement application for modifying the effect of temperature variation on the measuring result. For the temperature compensation, the component sensitive to temperature variation is often used with the cooperation of the analog-to-digital converter (ADC) inside the MCU. Preferably, the component sensitive to temperature variation described above is a thermistor.

For the conventional temperature compensation, an additional component is required for serving as the temperature sensor and an ADC channel has to be occupied, which is not economical in cost. Therefore, if the circuits and components essentially implicit in the MCU can be employed to accomplish the temperature compensation, without affecting their original functions, the cost thereof can be significantly saved.

Therefore, the present invention provides a novel circuit and method for the temperature compensation. The particular design in the present invention not only solves the problems described above, but is also easy to be implemented. Thus, the present invention has the utility for the industry.

SUMMARY OF THE INVENTION

In accordance with one aspect of the present invention, a circuit and method for the temperature compensation are provided. The method utilizes the watchdog timer oscillator essentially implicit in the MCU, an accurate timer and a stable voltage source to accomplish the temperature compensation.

In accordance with another aspect of the present invention, a circuit and method for the temperature compensation are provided, which are able to accomplish the temperature compensation without any additional components.

In accordance with a further aspect of the present invention, a temperature compensation circuit is provided. The temperature compensation circuit includes a first oscillator for providing a first clock signal, a timer electrically connected to the first oscillator for clocking a specific time period, a voltage regulator for generating a constant voltage, a second oscillator electrically connected to the voltage regulator for providing a second clock signal, and a counter electrically connected to the second oscillator for counting within the specific time period based on the second clock signal so as to obtain a counting value, thereby obtaining a frequency of the second oscillator for the temperature compensation.

Preferably, the first oscillator is a real-time clock oscillator.

Preferably, the second oscillator is a watchdog timer oscillator.

Preferably, the second clock signal is a clock frequency generated by the watchdog timer oscillator.

Preferably, the temperature compensation circuit further includes an enabling signal for switching on the watchdog timer oscillator.

Preferably, the temperature compensation circuit further includes a disabling signal for switching off the watchdog timer oscillator.

Preferably, the counter is an n-bit counter.

Preferably, the temperature compensation circuit further includes a clear signal for clearing the n-bit counter.

Preferably, the frequency of the second oscillator is a ratio of the counting value to the specific time period.

Preferably, the frequency of the second oscillator is converted into a temperature-related parameter for the temperature compensation.

In accordance with further another aspect of the present invention, a temperature compensation method for a circuit having a timer, an oscillator and a counter is provided. The temperature compensation method includes steps of (a) clocking a specific time period by the timer and counting by the counter, (b) counting continuously by the counter according to a clock frequency generated by the oscillator, (c) repeating the step (b) if the specific time period has not been fully clocked, (d) reading a counting value from the counter if the specific time period has been fully clocked, and (e) obtaining a frequency of the oscillator based on the counting value for the temperature compensation.

Preferably, the circuit is a measuring circuit.

Preferably, the oscillator is a watchdog timer oscillator.

Preferably, the counter is an n-bit counter.

Preferably, the counter is cleared by a clear signal.

Preferably, the frequency of the oscillator is a ratio of the counting value to the specific time period.

Preferably, the frequency of the oscillator is converted into a temperature-related parameter for the temperature compensation.

In accordance with further another aspect of the present invention, a temperature compensation circuit is provided. The temperature compensation circuit includes a timer for clocking a specific time period in response to a first clock signal, a oscillator for providing a second clock signal, and a counter electrically connected to the oscillator for counting within the specific time period based on the second clock signal so as to obtain a counting value, thereby obtaining a frequency of the oscillator for the temperature compensation.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

In the present invention, the watchdog timer oscillator essentially implicit in the ordinary MCU is employed. Meanwhile, a stable voltage source that is not subject to the temperature variation and an accurate timer are provided for the temperature compensation. Preferably, the stable voltage source is a built-in constant voltage regulator that is often used in the measuring circuit.

Generally, the frequency of the watchdog timer oscillator is mainly affected by the external temperature and the voltage source therefor. In the present invention, a stable voltage source has been provided as the power, so the frequency of the watchdog timer oscillator is only subject to the external temperature. The frequency of the watchdog timer oscillator varies correspondingly with the temperature. Therefore, the current temperature can be obtained through a pre-established frequency-to-temperature curve for the watchdog timer oscillator, and the temperature compensation can be performed based thereon.

Figure 1:
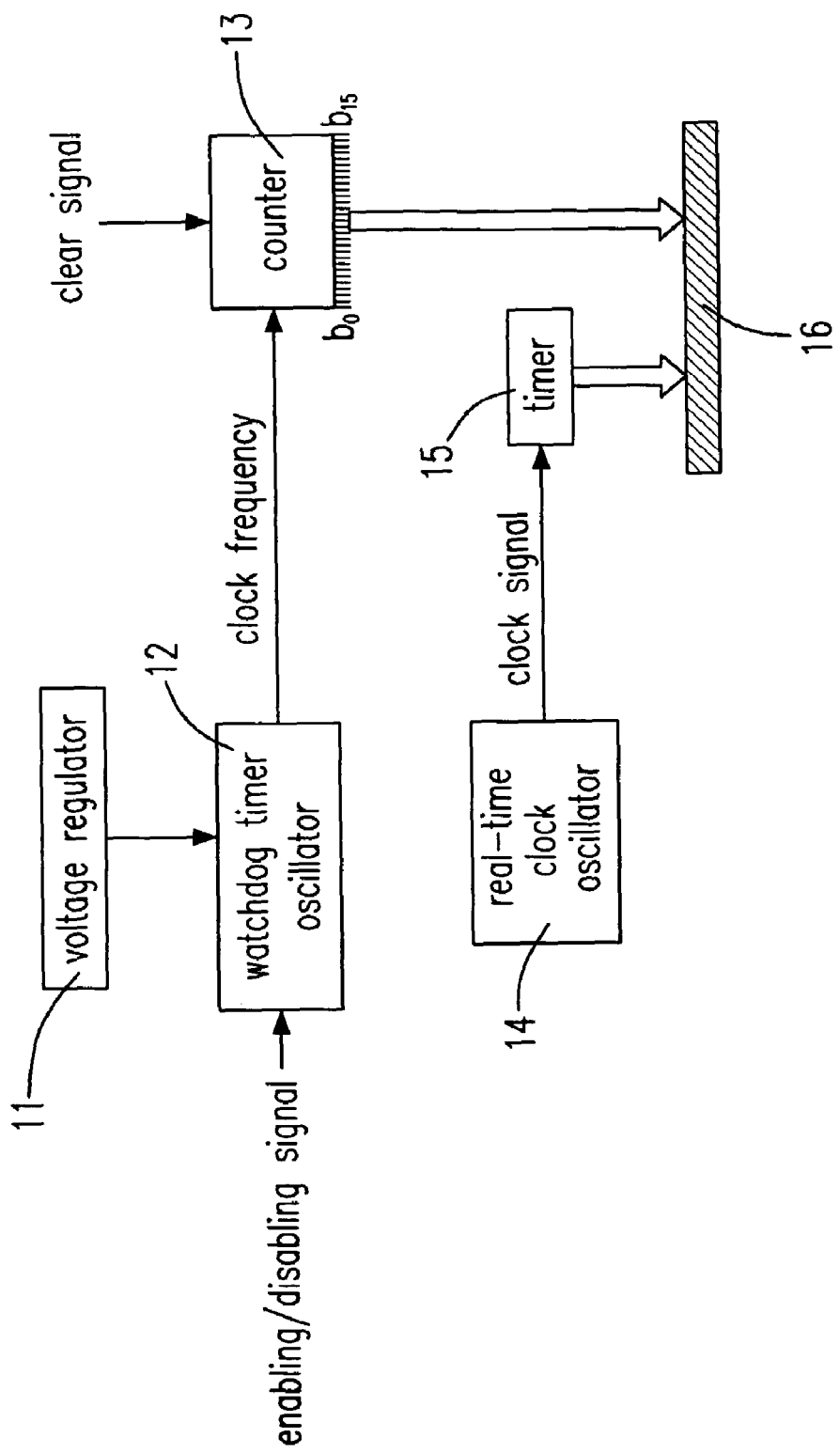
FIG. 1 is a schematic diagram showing the configuration of the temperature compensation circuit according to a preferred embodiment of the present invention.

Please refer to FIG. 1, which shows the configuration of the temperature compensation circuit 1 according to a preferred embodiment of the present invention. Preferably, the temperature compensation circuit 1 is applied for an electronic weight meter. The temperature compensation circuit 1 includes an accurate real-time clock oscillator 14, a timer 15, a voltage regulator 11, a watchdog timer oscillator 12 and a 16-bit counter 13. The real-time clock oscillator 14 is used for providing a clock signal for the timer 15. The voltage regulator 11 is used for generating a constant voltage as the power for the watchdog timer oscillator 12. Besides, an enabling signal is input to the watchdog timer oscillator 12 for switching on the watchdog timer oscillator 12 to perform the temperature compensation, while a disabling signal is also input to the watchdog timer oscillator 12 for switching off the watchdog timer oscillator 12 when the temperature compensation is not performed. The 16-bit counter 13 counts based on the clock frequency generated by the watchdog timer oscillator 12 so as to obtain the frequency of the watchdog timer oscillator 12. In addition, a clear signal is input to the 16-bit counter 13 for clearing the 16-bit counter 13 when the timer 15 starts to clock. The output of the timer 15 and the output of the counter 13 are connected to the common data bus 16.

Figure 2:
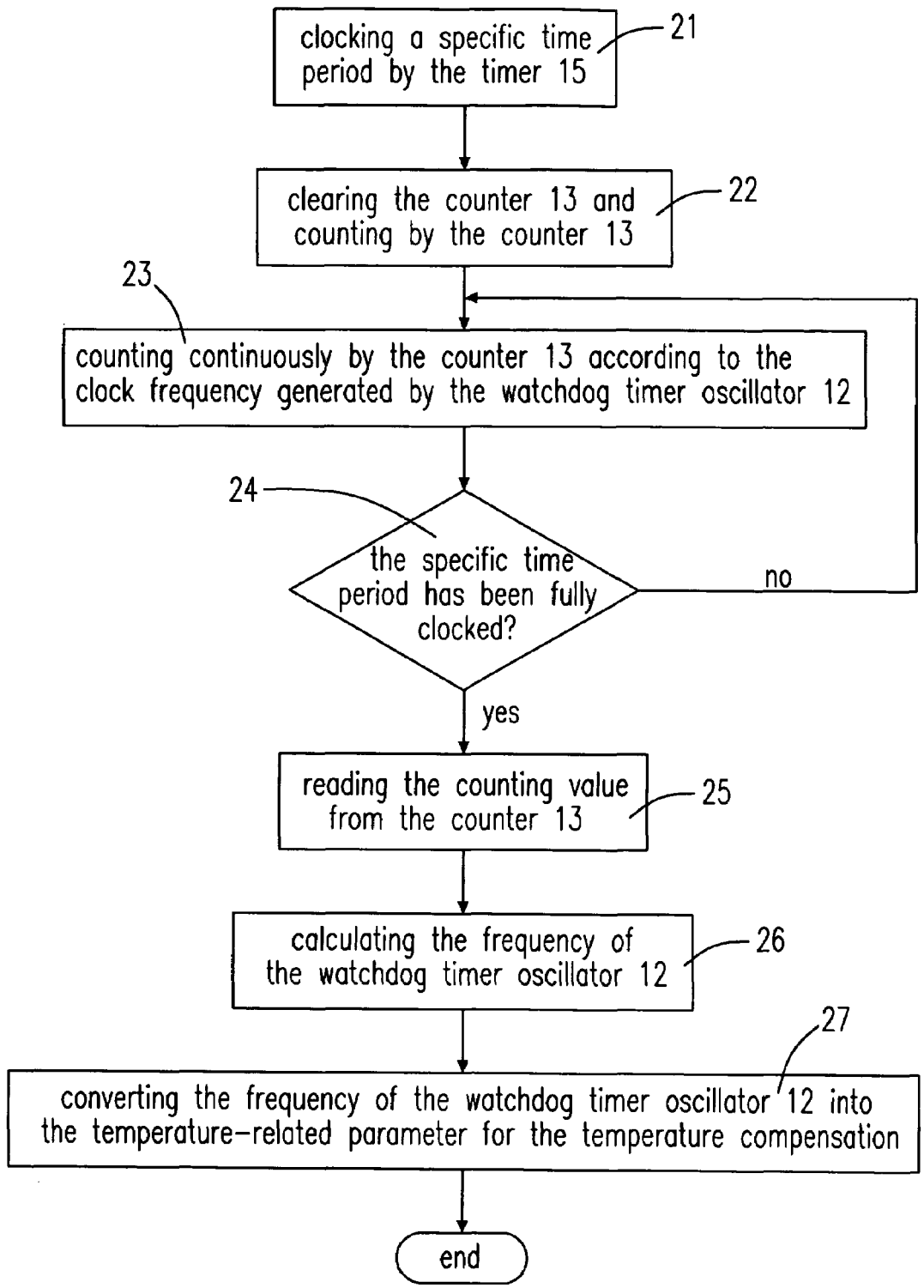
FIG. 2 is a flow chart of the temperature compensation method according to a preferred embodiment of the present invention.

In the beginning of the temperature compensation for the system, the watchdog timer oscillator 12 is switched on by the enabling signal. Referring now to FIG. 2, which shows the flow chart of the temperature compensation method according to a preferred embodiment of the present invention. The steps of the temperature compensation method are as follows.

1. A specific time period is set by the timer 15, and meanwhile the timer 15 starts to clock (step 21).

2. The counter 13 is cleared by the clear signal when the timer 15 starts to clock, and meanwhile the counter starts to count (step 22).

3. The counter 13 counts continuously according to the clock frequency generated by the watchdog timer oscillator 12 (step 23).

4. Determine whether the specific time period has been fully clocked (step 24). The procedure may proceed back to step 23 if the specific time period has not been fully clocked. Whereas the procedure may proceed to step 25 if the specific time period has been fully clocked.

5. The counting value is read form the counter 13 (step 25).

6. The frequency of the watchdog timer oscillator 12 is obtained from the ratio of the counting value to the specific time period (step 26).

7. The frequency of the watchdog timer oscillator 12 is converted into the temperature-related parameter for the temperature compensation (step 27).

In conclusion, the present invention utilizes the watchdog timer oscillator essentially implicit in the MCU, the accurate timer and the stable voltage source to accomplish the temperature compensation, and needs no additional components therefor. Accordingly, the present invention can effectively solve the problems and drawbacks in the prior art, and thus it fits the demand of the industry and is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A temperature compensation circuit, comprising:
a first oscillator for providing a first clock signal;
a timer electrically connected to said first oscillator for clocking a specific time period;
a voltage regulator for generating a constant voltage; a second oscillator electrically connected to said voltage regulator for providing a second clock signal; and
a counter electrically connected to said second oscillator for counting within said specific time period based on said second clock signal so as to obtain a counting value, thereby obtaining a frequency of said second oscillator for a temperature compensation.

2. The temperature compensation circuit as claimed in claim 1, wherein said first oscillator is a real-time clock oscillator.

3. The temperature compensation circuit as claimed in claim 1, wherein said second oscillator is a watchdog timer oscillator.

4. The temperature compensation circuit as claimed in claim 3, wherein said second clock signal is a clock frequency generated by said watchdog timer oscillator.

5. The temperature compensation circuit as claimed in claim 3, further comprising an enabling signal for switching on said watchdog timer oscillator.

6. The temperature compensation circuit as claimed in claim 3, further comprising a disabling signal for switching off said watchdog timer oscillator.

7. The temperature compensation circuit as claimed in claim 1, wherein said counter is an n-bit counter.

8. The temperature compensation circuit as claimed in claim 7, further comprising a clear signal for clearing said n-bit counter.

9. The temperature compensation circuit as claimed in claim 1, wherein said frequency of said second oscillator is a ratio of said counting value to said specific time period.

10. The temperature compensation circuit as claimed in claim 9, wherein said frequency of said second oscillator is converted into a temperature-related parameter for said temperature compensation.

11. A temperature compensation method for a circuit having a timer, an oscillator and a counter, comprising steps of:
   (a) clocking a specific time period by said timer and counting by said counter;
   (b) counting continuously by said counter according to a clock frequency generated by said oscillator;
   (c) repeating said step (b) if said specific time period has not been fully clocked;
   (d) reading a counting value from said counter if said specific time period has been fully clocked; and
   (e) obtaining a frequency of said oscillator based on said counting value for a temperature compensation.

12. The method as claimed in claim 11, wherein said circuit is a measuring circuit.

13. The method as claimed in claim 11, wherein said oscillator is a watchdog timer oscillator.

14. The method as claimed in claim 11, wherein said counter is an n-bit counter.

15. The method as claimed in claim 11, wherein said counter is cleared by a clear signal.

16. The method as claimed in claim 11, wherein said frequency of said oscillator is a ratio of said counting value to said specific time period.

17. The method as claimed in claim 16, wherein said frequency of said oscillator is converted into a temperature-related parameter for said temperature compensation.

18. A temperature compensation circuit, comprising:
   a timer for clocking a specific time period in response to a first clock signal;
   a oscillator for providing a second clock signal; and
   a counter electrically connected to said oscillator for counting within said specific time period based on said second clock signal so as to obtain a counting value, thereby obtaining a frequency of said oscillator for a temperature compensation.

* * * * *